United States Patent
Young

(10) Patent No.: US 6,374,279 B1
(45) Date of Patent: Apr. 16, 2002

(54) SYSTEM AND METHOD FOR INCREASING DUAL FIR FILTER EFFICIENCY

(75) Inventor: Wayne D. Young, Milpitas, CA (US)

(73) Assignee: NVIDIA U.S. Investment Company, Santa Clara, CA (US)

( * ) Notice: Subject to any disclaimer, the term of this patent is extended or adjusted under 35 U.S.C. 154(b) by 0 days.

(21) Appl. No.: 09/255,393

(22) Filed: Feb. 22, 1999

(51) Int. Cl.[7] ............................................... G06F 17/10
(52) U.S. Cl. ............................................... 708/319
(58) Field of Search ............................... 708/319, 316, 708/313, 445

(56) References Cited

U.S. PATENT DOCUMENTS 4,654,710 A  *  3/1987  Richard ................. 708/445
4,821,223 A  *  4/1989  David .................... 708/319
5,349,547 A  *  9/1994  Harrand ................. 708/319
5,761,074 A  *  6/1998  Nakamura .............. 708/445

* cited by examiner

*Primary Examiner*—David H. Malzahn
(74) *Attorney, Agent, or Firm*—Silicon Valley IP Group; Kevin J. Zilka

(57) ABSTRACT

A method and system are provided for efficiently implementing a dual finite impulse response (FIR) filter to vertically filter video data. A unique feedback mechanism enables multi-filter performance while implementing fewer actual filters and accompanying line delays than required in the available art. Advantageous placement of arithmetic elements is used to compensate for approximation error introduced by the feedback mechanism, resulting in substantially undiminished circuit performance in a more efficient circuit than currently available.

26 Claims, 5 Drawing Sheets

SYSTEM AND METHOD FOR INCREASING DUAL FIR FILTER EFFICIENCY

FIELD OF THE INVENTION

The present invention relates generally to the field of image processing and synthesis, and more particularly to decreasing line delay and other implementation resource requirements in finite impulse response (FIR) filters.

BACKGROUND OF THE INVENTION

In computers and other video processing systems, a utilized video output device (such as a monitor or television set) often has far lower resolution than the available video signal source. The data must therefore be re-formatted for the reduced output signal resolution. When re-formatting video images, it is necessary to filter and scale the image in both the vertical and horizontal dimensions. Filtering is normally performed prior to scaling to prevent the formation of aliasing artifacts, which would be introduced as a result of a scaling-induced decreased sampling rate. These and related terms are described and illustrated in chapter 14 of Computer Graphics, Principles and Practice, Foley, et al., published by Addison Wesley, 1996, incorporated herein by reference. The inventive system described herein improves the performance of the vertical filtering portion of this process.

FIG. 1 illustrates a system block diagram showing the placement of a vertical filter and scaler 110 and its position relative to other elements 120–150 of an image processing system. In the available art, the traditional method of filtering and scaling is to use a set of low pass Finite Impulse Response (FIR) filters to reduce image aliasing (also known as pre-filtering). Next, re-sampling the image at new sample positions scales the FIR filter output signal. Scaling is often accomplished with a simple bilinear interpolator, which creates a sample based on two adjacent source samples provided as input signals.

To provide a more detailed understanding of the available art, an available Vertical Filter and Scaler (VFS) 200 is illustrated in FIG. 2. The incoming video stream arrives interlaced. An interlaced video signal represents a picture as two separate fields. Each field usually represents half the lines in a frame. A frame represents one complete picture out of a sequence of pictures that make up a moving image. Typically, the lines in the first field will represent all the odd numbered lines in the frame and the second field will contain all the even numbered lines. In this way, the lines from one field fall between the lines of the other field with which they are interlaced. Thus, two adjacent lines in a video signal are spatially two lines apart in a frame and the line between them already occurred in the previous field. Therefore, to allow three spatially consecutive lines to be processed simultaneously, the middle line must be delayed for the period of one field so that it is available contemporaneously with the other two lines. Thus, while $i_{n-1}$ visually precedes $i_n$ on the screen, because the input video signal is interlaced, input signal $i_{n-2}$ is derived from the line that arrived immediately before line $i_n$, and line $i_{n-1}$ is actually from a corresponding line one "field" time before line $i_n$. The interlaced input signals to VFS 200 arrive as $i_n$, $i_{n-1}$ and $i_{n-2}$. These three lines are processed by Adaptive De-interlace Filter 210 which forwards three de-interlaced lines $d_{n-2}$, $d_{n-1}$ and $d_n$. The incoming video stream is thereby de-interlaced and the output signal is a non-interlaced (also referred to in the art as "progressive") video stream scaled to a desired height.

The three de-interlaced lines $d_{n-2}$, $d_{n-1}$ and $d_n$ are fed to the input terminals of a 3-tap anti-aliasing FIR filter 230, comprising a fixed coefficient filter having coefficients of whole powers of two. Having coefficients of whole powers of two allows for a simpler implementation of the filter over a "true" variable coefficient filter, since only additions need be performed instead of multiplications. FIR filter 230 thus produces a filtered version of $d_{n-1}$, referred to as $f_{n-1}$. While a fixed coefficient filter is easier to construct, it does not allow a variable amount of filtering to be applied to the signal. This function is performed by a cross-fader 250 which linearly mixes the filtered and non-filtered values of $d_{n-1}$ according to the value of the control $K_f$ according to the following equation:

$$m_{n-1}=K_f \cdot f_{n-1}+(1-K_f) \cdot d_{n-1} \quad \{\text{Where } 0<=K_f<=1\}$$

Using this method, it is known in the art to create a variable low pass filter (LPF) without the need for the complexity of a variable coefficient filter.

However, since the input signal has been de-interlaced, there need to be two lines output for every new input line ($i_n$ is the only truly new input line—$i_{n-1}$ and $i_{n-2}$ are just older, delayed versions of the input lines). It is therefore necessary in the available art to have a second FIR/cross-fader pair, illustrated as elements 220 and 240 in FIG. 2. Unfortunately, having a second FIR 240 raises a need for input line $d_{n-3}$ to be derived and forwarded to FIR filter 220. Since signal $d_{n-3}$ is not coming from De-Interlace Filter 210, signal $d_{n-3}$ is obtained by delaying $d_{n-1}$ by one (input) line.

It should be noted that a single input line delay is effectively the same as a two output-line delay. Since the output signal has been de-interlaced, a complete frame of video is produced on the output terminal for every field that is received at the input terminal. This results in twice as many lines being output as input. Thus, two lines are produced on the output terminal in the same time as a single line is input. This is achieved in the available art by including delay line 260, illustrated in FIG. 2.

There are now two de-interlaced and anti-alias filtered lines $m_{n-1}$ and $m_{n-2}$ coming from the low pass filter 205. The last step is to vertically scale these output signals to the desired vertical resolution. Vertical scaling is achieved by using an additional pair of cross-faders 280 and 290 to linearly interpolate the LPF output signals to provide lines line $_{n-2}$ and line $_{n-3}$. Scaling constants $K_0$ and $K_1$ effectively determine the positions of line $_{n-3}$ and line $_{n-2}$ with respect to lines $m_{n-3}$, $m_{n-2}$ and $m_{n-1}$. Therefore, signal $m_{n-3}$, which is not available at the output terminal of the LPF, is obtained by again delaying one of the output signals of the previous stage ($m_{n-1}$) with a second, one-line delay 270.

Thus, the shortcomings of the available architecture become apparent. The biggest cost element in the existing architecture are the line delays, which consume significant physical resources in the form of storage capacity, and consume Memory Controller 130 resources in the form of memory access bandwidth. For example, for a typical digital video input signal with an image size of 487 lines of 720 pixels, 16 bits per pixel and 30 frames per second, the required resources are as follows:

Storage cost=720×16×2=23,040 bits of storage.

Bandwidth cost=487×720×30×16×4=673 million bits per second (where the factor of 4 is included to accommodate two cycles for reading and two for writing). Those skilled in the relevant art will understand that the cost of the logic to implement various filter components is small compared to the cost of implementing the delay lines.

There is therefore a need in the art for a circuit and method that reduces the delay line resource requirements found in the available art.

SUMMARY OF THE INVENTION

To address the shortcomings of the available art, the present invention provides a dual variable finite impulse response ("FIR") filter (and method for filtering using such a circuit), comprising a filter element for receiving a data signal and generating a filtered signal, a first signal mixer mixing the data signal with the filtered signal to generate a first mixed output signal, a delay line delaying the first mixed output signal and generating a delayed signal, an averager element averaging the first mixed output signal and the delayed signal and generating an averaged signal, and a second signal mixer mixing the data signal with the averaged signal to generate a second mixed output signal, wherein the first mixed output signal, the second mixed output signal; and the delayed signal together comprise a dual variable FIR filter output signal.

An alternative embodiment provides a video signal filtering and scaling circuit comprising a FIR filter receiving a video signal and including a feedback element generating a signal delayed from a filtered output terminal, an averaging element receiving the delayed feedback signal, and a scaling element receiving at least the delayed feedback signal.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

Figure 1:
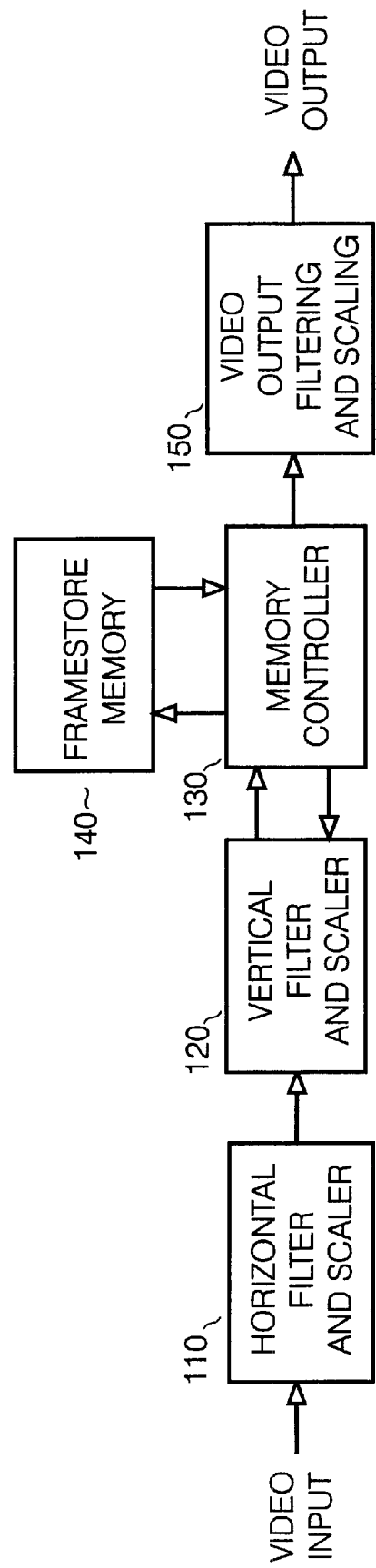
FIG. 1 illustrates placement of a vertical filter and scaler within an image processing system.

While the invention is capable of accommodating various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the claims.

DETAILED DESCRIPTION OF THE DRAWINGS

To reduce significantly the resources previously needed for vertical filtering and scaling of video, the present invention eliminates one of the line delays by providing a FIR filter feedback signal. A preferred embodiment of the inventive VFS architecture 300 is shown in FIG. 3. A single line delay 360 shown in its new configuration in FIG. 3, replaces line delays 260 and 270 in available VFS 200 in FIG. 2. This substitution provides the additional benefit of replacing second FIR filter 220 with a much simpler element, averager 320. Averager 320 is preferably a simple 2-input adder followed by a divide-by-2, the divide-by-2 being implemented effectively "for free" by simply shifting the result down by one bit. Thus, a dual FIR filter output signal and effect is achieved in VFS 300 with actual implementation of only a single FIR filter.

In the inventive system of FIG. 3, only one delay is needed since averaging the preceding FIR filter output signal mn-3 and succeeding FIR filter output signal mn-1 approximates signal mn-2. This begins with filtering signal $d_{n-2}$ to produce filtered output signal $f_{n-2}$. Output signal $m_{n-1}$ of cross-fader 350 and the delayed output signal m-$_{n-3}$ of delay line 360 are averaged together using averager 320 to produce filtered signal $f_{n-2}$. Signal $f_{n-2}$ is then mixed with unfiltered signal $d_{n-2}$ as before, using cross-fader 340 to produce approximated signal $m_{n-2}$. The signal $m_{n-3}$ on the input terminal to Output Scaling Interpolator 395 is thereby forwarded by the FIR filter instead of directly from a one line delay. However, the forwarded signal is directly equivalent to that generated using significantly greater resources in the available system illustrated in FIG. 2.

Figure 2:
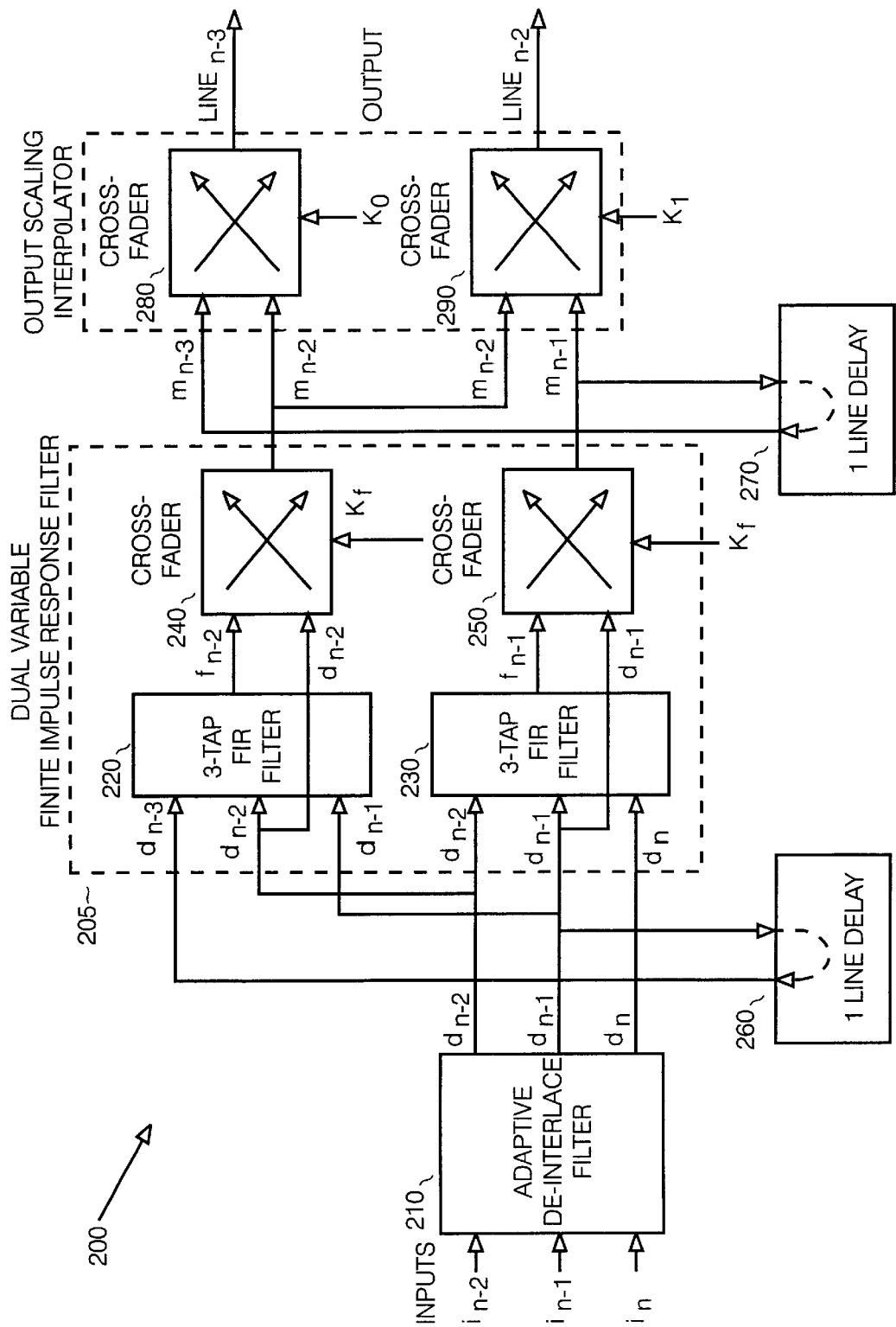
FIG. 2 illustrates a traditional method of filtering a digital video signal.
Figure 3:
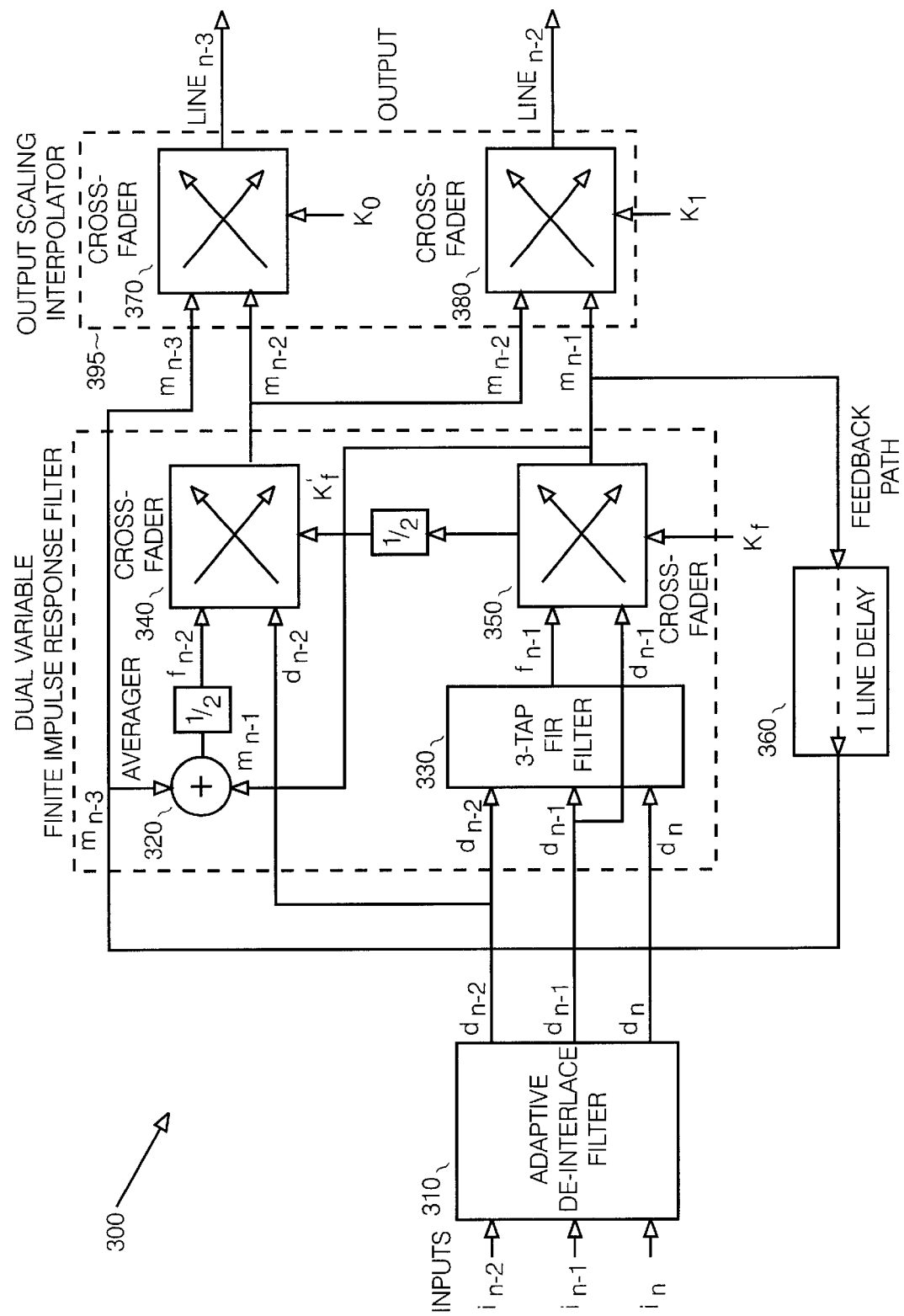
FIG. 3 illustrates a preferred embodiment of the vertical filter and scaler of the present invention.

It should be noted that because cross-fader 340 is used to vary the amount of filtering applied to signal $d_{n-2}$, when no filtering occurs (that is, when constant $K_f$ equals 0), then signal $m_{n-2}$ equals signal $d_{n-2}$, as with the available system illustrated in FIG. 2. This ensures that the inventive filter is able to pass the signal through unmodified when no filtering or scaling is required.

Using the technique of the present invention thereby effectively halves the storage and bandwidth requirements of the filter and thus provides considerable savings over the available approach.

The value and significance of signals $K_f$, $K_0$ and $K_1$ are determined as follows. $K_f$ controls the amount of filtering that should be applied to the signal before it is scaled by output scaling interpolators 370 and 380 in FIG. 3. When scaling between 1 and 0.5, $K_f$ is set according to the equation $K_f=2(1-S)$, where S is the scale factor and has the range $0.5 \leq S \leq 1.0$. This value preferably remains constant throughout an entire frame period.

$K_0$ and $K_1$ are determined on a line by line basis and, like $K_f$, also depend on the scale factor. An accumulator accumulates the scale factor, and the values of $K_0$ and $K_1$ are determined from this accumulated result. The following process is performed for each pair of output lines:

$K_0$=frac(A)

A=A+(1/S)

$K_1$ =frac(A)

A=A+(1/S)

where A is the value of the accumulator, and the function frac( ) returns the fractional part of its parameter.

While circuitry for deriving and forwarding these constants is not illustrated in the figures, it will be understood from the above description by one skilled in the art to which the present invention pertains how signals $K_f$, $K_0$ and $K_1$ are determined.

In the architecture of FIG. 2, the three coefficients of the FIR filters are commonly chosen to be 0.25, 0.5 and 0.25, respectively. These values are easy to implement in hardware and provide an effective low pass filter. The equation for $m_{n-2}$ in FIG. 2 is therefore as follows:

$$m_{n-2} = \frac{K_f \cdot d_{n-3}}{4} + \frac{(1-K_f) \cdot d_{n-2}}{2} + \frac{K_f \cdot d_{n-}}{4}$$

By expanding out these equations for the inventive architecture shown in FIG. 3 and collecting common terms, the following equation is obtained for the new filter:

$$m_{n-2} = \frac{K_f^2 \cdot d_{n-4}}{8} + \frac{K_f \cdot (1-K_f) \cdot d_{n-3}}{2} + \frac{(1-K_f+K_f^2) \cdot d_{n-2}}{4} + \frac{K_f \cdot (1-K_f) \cdot d_{n-1}}{2} + \frac{K_f^2 \cdot d}{8}$$

There are therefore two additional terms—for $d_{n-4}$ and $d_n$—which were not found in the original equations. The extra terms and the higher order elements in the other terms result in a more severe filtering operation on the video input signal, resulting in an image that appears "softer" than expected or desired.

Figure 4:
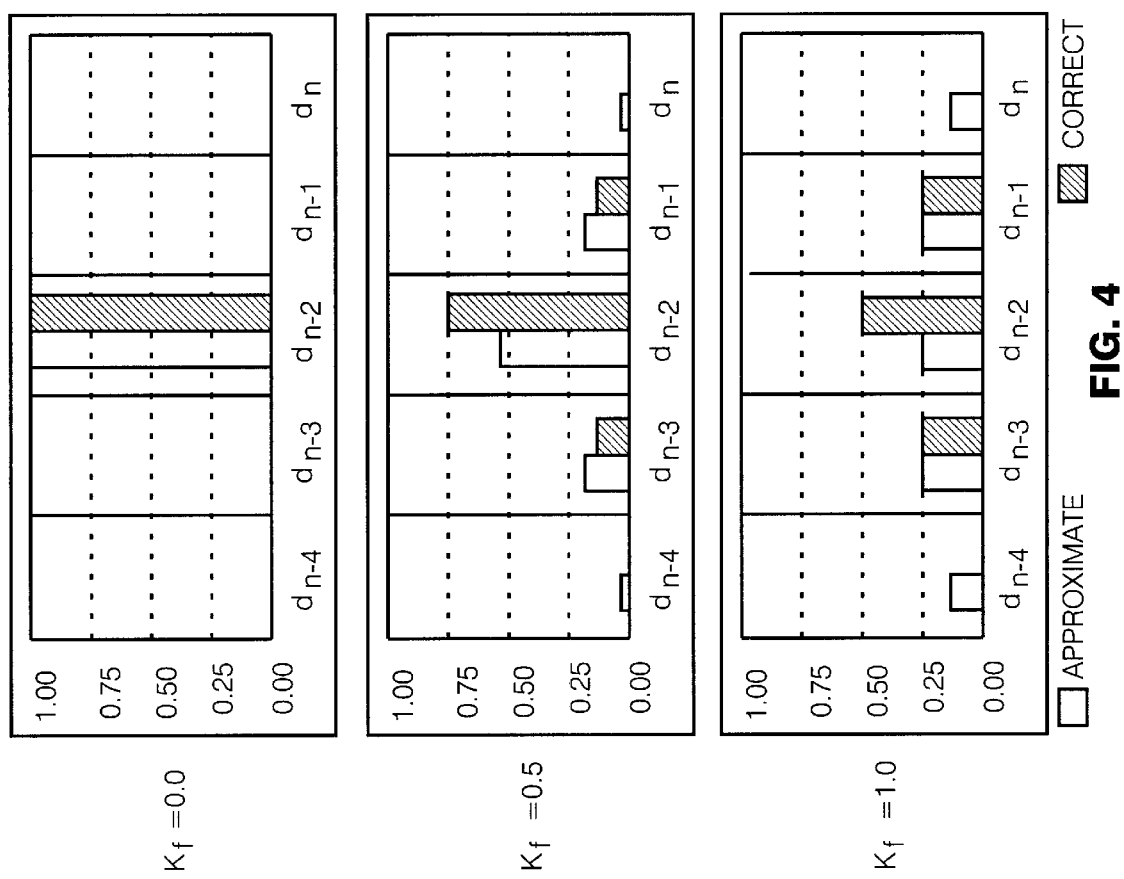
FIG. 4 provides an impulse response comparison of a corrected filter and an approximation.

The undesirable side effect of approximation made when averaging preceding and succeeding lines is addressed as follows. A graphical representation of the encountered errors is provided in FIG. 4, which displays the impulse response of each filter as a bar chart. Each bar represents a filter output signal sample generated from a single unity input sample. As can be seen, there is no difference between the two filters when $K_f=0$. However, by the time $K_f=1.0$, there are large differences in the impulse responses. The response of the inventive filter is much flatter and wider—resulting in an image that looks much softer on the screen than the signal generated by the available system.

To address this effect, a modified value of $K_f$ is supplied to cross-fader 340 associated with the signal $m_{n-2}$, as illustrated in FIG. 3. If the value of $K_f$ is divided by 2 (an easy operation in a digital system, as explained above) then the equations for $m_{n-2}$ are reduced to:

$$m_{n-2} = \frac{K_f^2 \cdot d_{n-4}}{32} + \frac{K_f \cdot (1-K_f) \cdot d_{n-3}}{4} + \frac{(1-K_f}{2} + \frac{K_f^2) \cdot d_{n-2}}{16} + \frac{K_f \cdot (1-K_f) \cdot d_{n-1}}{4} + \frac{K_f^2 \cdot d}{32}.$$

Figure 5:
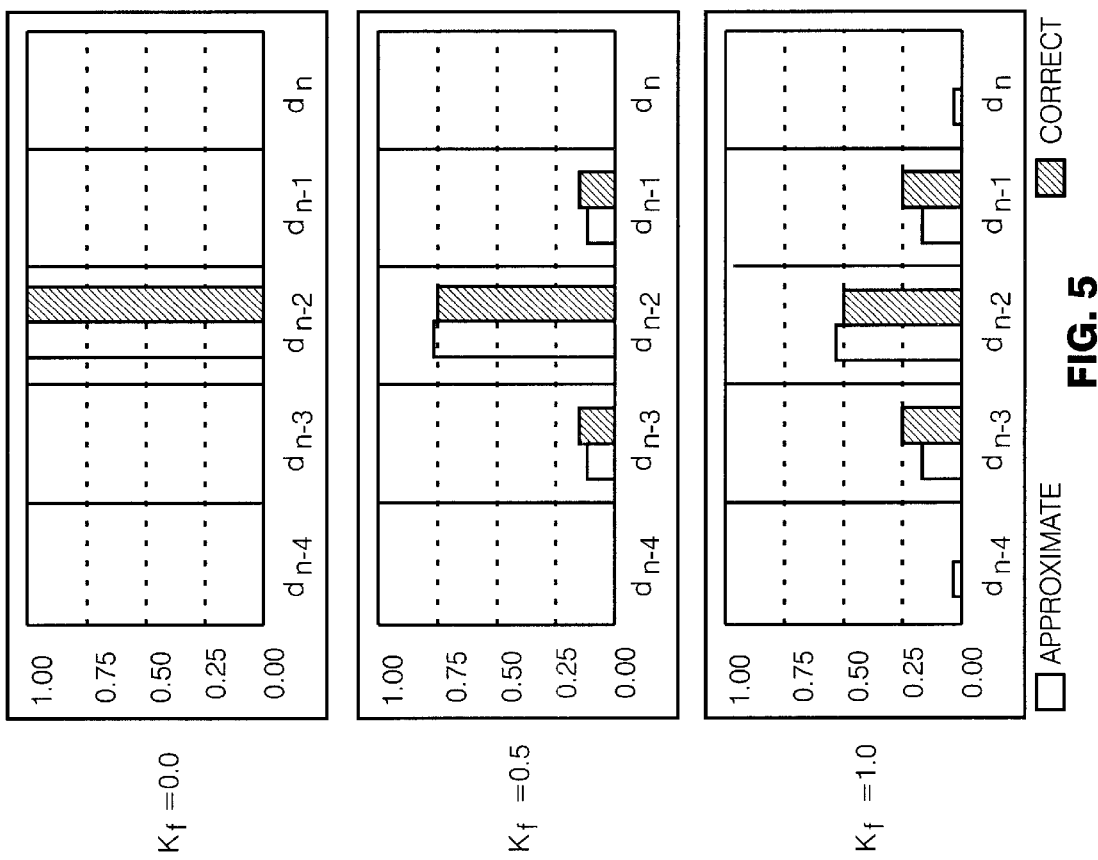
FIG. 5 provides an impulse response comparison of the inventive filter having a modified value of $K_f$.

By simple observation, it can be seen that the $K_f$ squared terms are very small and can be ignored without incurring significant error. If this is done, the equation degenerates to that of the theoretical equation shown above for FIG. 2. As illustrated in FIG. 5, which shows the impulse response of the filter with the modified $K_f$, the output signal of the averaging filter as illustrated in FIG. 3 is almost indistinguishable from the original filter illustrated in FIG. 2, but with a substantial savings of implementation resources.

The present invention may also be applied to FIR Low Pass Filters having a higher number of taps. In any situation where three LPF output signals are required (the "m" lines in FIGS. 2 and 3) the inventive feedback mechanism of the present invention can be used to estimate signal $m_{n-2}$ from $m_{n-1}$ and $m_{n-3}$. The averaging process conveys a heavy low pass filtering effect to the signal. An averager is effectively a 2-tap Simple Moving Average Filter (SMAF). This would normally cause undue visual softening of the image. However, the image has already been low pass filtered by the 3-tap FIR filter prior to the averaging process, so there is little change in the signal. The inventive technique is effective at least in part because $m_{n-1}$ and $m_{n-3}$ are bandwidth limited, so very little signal degradation occurs when the signals are averaged. This is especially true where an adjustment factor is applied to the value of $K_f$ controlling the mixing of the filtered and non-filtered values of signal $d_{n-2}$, as explained above.

The present invention therefore provides a method and system for efficiently implementing a dual finite impulse response (FIR) filter to vertically filter and scale video data. Although the present invention has been shown and described with respect to preferred embodiments, various changes and modifications lie within the spirit and scope of the claimed invention. For example, the method and structure of the present invention could also be applied to horizontal filtering, or in fact any dual low pass filter incorporating delay elements. The corresponding structures, materials, acts, and equivalents of all means or step plus function elements in the claims are intended to include any structure, material, or acts for performing the functions in combination with other elements as specifically claimed.

What is claimed is:

1. A dual variable finite impulse response ("FIR") filter, comprising:
    a filter element for receiving a data signal and generating a filtered signal;
    a first signal mixer in electrical communication with the filter element, the first signal mixer mixing the data signal with the filtered signal to generate a first mixed output signal;
    a delay line delaying the first mixed output signal, generating a delayed signal;
    an averager element, averaging the first mixed output signal and the delayed signal to generate an averaged signal; and
    a second signal mixer in electrical communication with the averager element, the second signal mixer mixing the data signal with the averaged signal to generate a second mixed output signal;
    wherein the first mixed output signal, the second mixed output signal; and the delayed signal together comprise a dual variable FIR filter output signal.

2. The FIR filter of claim 1, wherein the averager comprises a divide-by-two element in series with an adder element.

3. The FIR filter of claim 1, wherein the composition of the first mixed output signal is controlled at least in part by a first constant $K_f$ derived from the equation $K_f=2(1-S)$, where S is a scale factor applied to the data signal.

4. The FIR filter of claim 1, wherein the composition of the second mixed output signal is controlled at least in part by a second constant equaling substantially half the value of a first constant $K_f$, the first constant at least in part controlling the composition of the first mixed output signal.

5. A method of filtering a video signal, the method comprising the steps of:
    receiving a data signal at a filter element, thereby generating a filtered signal;
    mixing the data signal, at a first signal mixer, with the filtered signal, thereby generating a first mixed output signal;
    delaying the first mixed output signal through a delay line, thereby generating a delayed signal;
    averaging the first mixed output signal and the delayed signal at an averager element, thereby generating an averaged signal; and
    mixing the data signal, at a second signal mixer, with the averaged signal thereby generating a second mixed output signal;
    wherein the first mixed output signal, the second mixed output signal; and the delayed signal together comprise a dual variable FIR filter output signal.

6. The method of claim 5, wherein the averaging step comprises adding the first mixed output signal and the delayed signal, generating a summed signal, and then dividing by two the summed signal.

7. The method of claim 5, wherein the composition of the first mixed output signal is controlled at least in part by a first constant $K_f$ derived from the equation $K_f=2(1-S)$, where S is a scale factor applied to the data signal.

8. The method of claim 5, wherein the composition of the second mixed output signal is controlled at least in part by a second constant equaling substantially half the value of a first constant $K_f$, the first constant at least in part controlling the composition of the first mixed output signal.

9. A video signal filtering and scaling circuit comprising:
    a FIR filter, the FIR filter receiving a video signal and including an averaging element receiving a delayed feedback signal;
    a feedback element generating the delayed feedback signal from a filtered output terminal; and
    a scaling element receiving at least the delayed feedback signal.

10. The circuit of claim 9, wherein the received video signal is progressive.

11. The circuit of claim 9, wherein the FIR filter comprises a dual variable FIR filter.

12. A circuit including a dual variable finite impulse response ("FIR") filter, comprising:
    a filter element for receiving a data signal and generating a filtered signal;
    a first signal mixer in electrical communication with the filter element, the first signal mixer mixing the data signal with the filtered signal to generate a first mixed output signal;
    a delay line delaying the first mixed output signal, generating a delayed signal;
    an averager element, averaging the first mixed output signal and the delayed signal to generate an averaged signal; and
    a second signal mixer in electrical communication with the averager element, the second signal mixer mixing the data signal with the averaged signal to generate a second mixed output signal;
    wherein the first mixed output signal, the second mixed output signal; and the delayed signal together comprise a dual variable FIR filter output signal.

13. The circuit of claim 12 further comprising a third signal mixer in electrical communication with the second signal mixer and the delay line, the third signal mixer mixing the delayed signal and the second mixed output signal to generate a scaled output signal.

14. The circuit of claim 13 further comprising a fourth signal mixer in electrical communication with the first signal mixer and the second signal mixer, the fourth signal mixer mixing the first mixed output signal and the second mixed output signal to generate a scaled output signal.

15. The circuit of claim 13, wherein the composition of the third mixed output signal is controlled at least in part by a constant $K_0$, where $K_0$ is the fractional portion of an accumulated, inverted scale factor.

16. The circuit of claim 12 further comprising a third signal mixer in electrical communication with the first signal mixer and the second signal mixer, the third signal mixer mixing the first mixed output signal and the second mixed output signal to generate a scaled output signal.

17. The circuit of claim 16 further comprising a fourth signal mixer in electrical communication with the second signal mixer and the delay line, the fourth signal mixer mixing the delayed signal and the second mixed output signal to generate a scaled output signal.

18. The circuit of claim 16, wherein the composition of the third mixed output signal is controlled at least in part by a constant $K_1$, where $K_1$ is the fractional portion of an accumulated, inverted scale factor.

19. The circuit of claim 12 further comprising a scaling interpolator, the scaling interpolator comprising a plurality of signal mixers.

20. A method comprising:
    receiving a data signal at a filter element, thereby generating a filtered signal;
    mixing the data signal, at a first signal mixer, with the filtered signal, thereby generating a first mixed output signal;
    delaying the first mixed output signal through a delay line, thereby generating a delayed signal;
    averaging the first mixed output signal and the delayed signal at an averager element, thereby generating an averaged signal; and
    mixing the data signal, at a second signal mixer, with the averaged signal thereby generating a second mixed output signal;
    wherein the first mixed output signal, the second mixed output signal; and the delayed signal together comprise a dual variable FIR filter output signal.

21. The method of claim 20 further comprising mixing the delayed signal and the second mixed output signal, at a third signal mixer, thereby generating a scaled output signal.

22. The method of claim 21 further comprising mixing the first mixed output signal and the second mixed output signal, at a fourth signal mixer, thereby generating a scaled output signal.

23. The method of claim 21, wherein the composition of the third mixed output signal is controlled at least in part by a constant $K_0$, where $K_0$ is the fractional portion of an accumulated, inverted scale factor.

24. The method of claim 20 further comprising mixing the first mixed output signal and the second mixed output signal, at a third signal mixer, thereby generating a scaled output signal.

25. The method of claim 24 further comprising mixing the delayed signal and the second mixed output signal, at a fourth signal mixer, thereby generating a scaled output signal.

26. The method of claim 24, wherein the composition of the third mixed output signal is controlled at least in part by a constant $K_1$, where $K_1$ is the fractional portion of an accumulated, inverted scale factor.

* * * * *